(12) United States Patent
Li et al.

(10) Patent No.: US 11,948,967 B2
(45) Date of Patent: Apr. 2, 2024

(54) POLYSILICON RESISTOR

(71) Applicant: HUAWEI TECHNOLOGIES CO., LTD., Guangdong (CN)

(72) Inventors: Ding Li, Shenzhen (CN); Shuai Du, Chengdu (CN); Yixing Chu, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 758 days.

(21) Appl. No.: 17/077,329

(22) Filed: Oct. 22, 2020

(65) Prior Publication Data

US 2021/0043720 A1    Feb. 11, 2021

Related U.S. Application Data

(63) Continuation of application No. PCT/CN2018/115137, filed on Nov. 13, 2018.

(30) Foreign Application Priority Data

Apr. 25, 2018 (CN) .......................... 201810380599.4

(51) Int. Cl.
*H01C 7/00* (2006.01)
*H01C 1/14* (2006.01)
*H01L 49/02* (2006.01)

(52) U.S. Cl.
CPC .............. *H01L 28/24* (2013.01); *H01C 1/14* (2013.01); *H01C 7/006* (2013.01)

(58) Field of Classification Search
CPC ....... H01L 28/20; H01L 28/24; H01L 23/647; H01C 1/14; H01C 7/006
See application file for complete search history.

(56) References Cited

U.S. PATENT DOCUMENTS

| | | | |
|---|---|---|---|
| 4,263,518 A | 4/1981 | Ballatore et al. | |
| 6,180,479 B1 | 1/2001 | Yoshikawa | |
| 7,642,892 B1 | 1/2010 | Kang | |
| 8,878,334 B1 | 11/2014 | Ratnakumar et al. | |
| 9,553,139 B2 * | 1/2017 | Onishi | ................ H01L 27/0802 |
| 2018/0102404 A1 * | 4/2018 | Wen | .................... H03F 3/45973 |

FOREIGN PATENT DOCUMENTS

| | | |
|---|---|---|
| CN | 101442051 A | 5/2009 |
| CN | 102931185 A | 2/2013 |
| CN | 104749511 A | 7/2015 |
| CN | 105895622 A | 8/2016 |
| CN | 107947757 A | 4/2018 |
| JP | 2002353326 A | 12/2002 |

* cited by examiner

*Primary Examiner* — Tucker J Wright
(74) *Attorney, Agent, or Firm* — WOMBLE BOND DICKINSON (US) LLP

(57) ABSTRACT

A polysilicon resistor is disclosed, to reduce a voltage coefficient of the polysilicon resistor. The polysilicon resistor includes: a polysilicon layer (101), a voltage module (102), and a substrate layer (103), where the voltage module (102) is configured to transmit a voltage on the polysilicon layer (101) to the substrate layer (103).

19 Claims, 8 Drawing Sheets

POLYSILICON RESISTOR

CROSS-REFERENCE TO RELATED APPLICATIONS

This application is a continuation of International Application No. PCT/CN2018/115137, filed on Nov. 13, 2018, which claims priority to Chinese Patent Application No. 201810380599.4, filed on Apr. 25, 2018. The disclosures of the aforementioned applications are hereby incorporated by reference in their entireties.

TECHNICAL FIELD

This application relates to the field of semiconductor technologies, and in particular, to a polysilicon resistor.

BACKGROUND

Resistors are the most basic passive components in analog circuits and mixed signal systems. With the evolution of technologies, the resistors commonly used in integrated circuits have gradually evolved from diffused resistors and implanted resistors to polysilicon (poly) resistors.

In general application scenarios, the voltage coefficient of the poly resistor may usually be ignored, that is, the resistance value of the poly resistor does not change with the voltage applied to both ends of the poly resistor. However, in some application fields that require very high linearity, such as analog to digital conversion (ADC), digital to analog conversion DAC), and audio driving, the voltage coefficient of the poly resistor may cause distortion of output signals, greatly affecting system performance. In this case, the impact of the voltage coefficient of the poly resistor on the resistance value is still not considered, the test performance of a semiconductor chip may be far lower than the simulation performance.

However, at present, there are few studies on the voltage coefficient of the poly resistor, and there is no method for adjusting the voltage coefficient of the poly resistor.

SUMMARY

Embodiments of this application provide a polysilicon resistor, so as to reduce a voltage coefficient of the polysilicon resistor.

To resolve the foregoing technical problem, the embodiments of this application provide the following technical solutions.

According to a first aspect, an embodiment of this application provides a polysilicon resistor. The polysilicon resistor includes a polysilicon layer, a voltage module, and a substrate layer. The voltage module is configured to transmit a voltage on the polysilicon layer to the substrate layer.

According to a first aspect, an embodiment of this application provides a polysilicon resistor. The polysilicon resistor includes a polysilicon layer, a voltage module, and a substrate layer. The voltage module is configured to transmit a voltage on the polysilicon layer to the substrate layer. In an embodiment of this application, the polysilicon resistor includes the voltage module. The voltage module can transmit the voltage of the polysilicon layer to the substrate layer. Therefore, the substrate layer is connected to the voltage of the polysilicon layer. When a positive terminal voltage and a negative terminal voltage of the polysilicon layer change, the voltage of the polysilicon layer can be transmitted to the substrate layer, so that a voltage of the substrate layer can be adjusted following the change of the positive terminal voltage and the negative terminal voltage of the polysilicon layer, that is, a voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

In an embodiment, the substrate layer includes an N-well and a P-type substrate, and the voltage transmitted by the voltage module to the substrate layer is applied to the N-well; alternatively, the substrate layer includes a deep N-well, a P-well, and a P-type substrate, and the voltage transmitted by the voltage module to the substrate layer is applied to the P-well. The P-type substrate may also be referred to as a semiconductor substrate. If the substrate layer is an N-well, the polysilicon resistor formed through the substrate layer is the polysilicon resistor in the N-well, and the voltage transmitted by the voltage module to the substrate layer is applied to the N-well. For example, the voltage module connects the polysilicon layer and the N-well, so that the voltage of the polysilicon layer can be transmitted to the N-well. The substrate potential on the N-well cannot be less than zero. If the substrate layer is a DNW and a P-well, the polysilicon resistor formed through the substrate layer is the polysilicon resistor in the P-well, and the voltage transmitted by the voltage module to the substrate layer is applied to the P-well. For example, the voltage module connects the polysilicon layer and the P-well, so that the voltage of the polysilicon layer can be transmitted to the P-well.

In an embodiment, the polysilicon layer includes a first polysilicon node corresponding to a positive terminal voltage of the polysilicon layer, and a second polysilicon node corresponding to a negative terminal voltage of the polysilicon layer; the P-type substrate, the N-well, the first polysilicon node, and the second polysilicon node form an ohmic contact on the substrate layer; alternatively, the P-type substrate, the P-well, the first polysilicon node, and the second polysilicon node form an ohmic contact on the substrate layer. A positive terminal voltage and a negative terminal voltage are input to the polysilicon layer, a node where the positive terminal voltage is input on the polysilicon layer is the first polysilicon node, and a node where the negative terminal voltage is input on the polysilicon layer is the second polysilicon node. The substrate layer including the N-well and the P-type substrate is used as an example. The P-type substrate, the N-well, the first polysilicon node corresponding to the positive terminal voltage of the polysilicon layer, the second polysilicon node corresponding to the negative terminal voltage of the polysilicon layer, and a semiconductor substrate of the semiconductor chip form an ohmic contact on the substrate layer. The formation of an ohmic contact between metal and a semiconductor refers to pure resistance where the metal comes into contact with the semiconductor. The smaller the resistance, the better the effect is. In this case, when the polysilicon resistor is operated, most of the voltage drop occurs in an active region instead of the contact surface. Therefore, current and voltage characteristics of the polysilicon resistor forming the ohmic contact have a linear relationship. The larger the slope, the smaller the contact resistance. The size of the contact resistance directly affects the performance indicators of the device.

In an embodiment, an input of the voltage module comes from an intermediate voltage of the polysilicon layer, and the intermediate voltage is a voltage value between the positive terminal voltage and the negative terminal voltage of the polysilicon layer. The voltage module can be connected to a polysilicon node corresponding to the intermediate voltage of the polysilicon layer, so that the input of the voltage module comes from the intermediate voltage of the polysilicon layer; the voltage module can also be connected to the substrate node of the substrate layer, so that an input of the substrate node comes from an output of the voltage module.

In an embodiment, an input of the voltage module comes from an average value of the positive terminal voltage and the negative terminal voltage of the polysilicon layer. The input of the voltage module comes from the average value of the positive terminal voltage and the negative terminal voltage of the polysilicon layer, so that the voltage value of the substrate layer may be equal to the average value of the positive terminal voltage and the negative terminal voltage of the polysilicon layer. The resistance value of the polysilicon resistor remains constant within an effective error range, and impact of depletion of the polysilicon layer on the resistance value of the polysilicon resistor is eliminated, so that the voltage coefficient of the polysilicon resistor can be reduced.

In an embodiment, the voltage module includes a first wire, a second wire, and a buffer, where each of the first wire and the second wire has two ends; the buffer is connected to one end of the first wire and one end of the second wire; the other end of the first wire is connected to the substrate layer, and the other end of the second wire is connected to the polysilicon layer. The voltage module includes the buffer, an output end of the buffer is connected to the first wire, the first wire is then connected to the substrate layer; an input end of the buffer is connected to the second wire, and the second wire is then connected to the polysilicon layer, so that the voltage of the polysilicon layer can be transmitted to the substrate layer through the first wire, the second wire, and the buffer, and the voltage of the polysilicon layer can be input to the substrate layer.

In an embodiment, the voltage module includes a first voltage unit and a second voltage unit, where two ends of the first voltage unit are respectively connected to a first substrate node of the substrate layer, and the first polysilicon node corresponding to the positive terminal voltage of the polysilicon layer; two ends of the second voltage unit are respectively connected to a second substrate node of the substrate layer, and the second polysilicon node corresponding to the negative terminal voltage of the polysilicon layer; the first substrate node is a node, at the substrate layer, residing on the same side as the first polysilicon node, and the second substrate node is a node, at the substrate layer, residing on the same side as the second polysilicon node. Specifically, the first substrate node of the substrate layer is connected to the first polysilicon node corresponding to the positive terminal voltage of the polysilicon layer through the first voltage unit; the second substrate node of the substrate layer is connected to the second polysilicon node corresponding to the negative terminal voltage of the polysilicon layer through the second voltage unit; the first substrate node is a substrate node at the substrate layer residing on the same side as the first polysilicon node; the second substrate node is a substrate node at the substrate layer residing on the same side as the second polysilicon node. The first substrate node is a substrate node at the substrate layer residing on the same side as the first polysilicon node, where the same side may be the left side; the second substrate node is a substrate node at the substrate layer residing on the same side as the second polysilicon node, where the same side may be the right side.

In an embodiment, the first substrate node and the second substrate node are symmetric with respect to a center point of the substrate layer. The positive terminal voltage of the polysilicon layer can be input to the first substrate node through the first voltage unit, and the negative terminal voltage of the polysilicon layer can be input to the second substrate node through the second voltage unit. If the first substrate node and the second substrate node are symmetric with respect to the center point of the substrate layer, and voltages on the first substrate node and the second substrate node at the substrate layer can be averaged, so that the voltage value of the substrate layer may be equal to the average value of the voltages on the first substrate node and the second substrate node. This can implement dynamic adjustment of the voltage value of the substrate layer, so that the resistance value of the polysilicon resistor remains constant within the effective error range, and the voltage coefficient of the polysilicon resistor is reduced.

In an embodiment, the first voltage unit includes a third wire, a fourth wire, and a first buffer, where each of the third wire and the fourth wire has two ends; the first buffer is connected to one end of the third wire and one end of the fourth wire; the other end of the third wire is connected to the first substrate node, and the other end of the fourth wire is connected to the first polysilicon node. The first voltage unit includes the first buffer, an output end of the first buffer is connected to the third wire, the third wire is then connected to the substrate layer; an input end of the first buffer is connected to the fourth wire, and the fourth wire is then connected to the polysilicon layer, so that the positive terminal voltage of the polysilicon layer can be transmitted to the substrate layer through the third wire, the fourth wire, and the first buffer, and the voltage of the polysilicon layer can be input to the substrate layer.

In an embodiment, the second voltage unit includes a fifth wire, a sixth wire, and a second buffer, where each of the fifth wire and the sixth wire has two ends; the second buffer is connected to one end of the fifth wire and one end of the sixth wire; the other end of the fifth wire is connected to the second substrate node, and the other end of the sixth wire is connected to the second polysilicon node. The second voltage unit includes the second buffer, an output end of the second buffer is connected to the fifth wire, the fifth wire is then connected to the substrate layer; an input end of the second buffer is connected to the sixth wire, and the sixth wire is then connected to the polysilicon layer, so that the negative terminal voltage of the polysilicon layer can be transmitted to the substrate layer through the fifth wire, the sixth wire, and the second buffer, and the voltage of the polysilicon layer can be input to the substrate layer.

In an embodiment, the polysilicon resistor further includes an isolation layer, where the polysilicon layer is located in an upper surface area of the isolation layer, and the isolation layer is located in an upper surface area of the substrate layer.

According to a second aspect, an embodiment of this application further provides a polysilicon resistor. The polysilicon resistor includes a polysilicon layer and a substrate layer. A polysilicon node is disposed on the polysilicon layer, a substrate node is disposed on the substrate layer, and the substrate node is connected to the polysilicon node.

In an embodiment, the substrate node is an ohmic contact point.

In an embodiment, that the substrate node is connected to the polysilicon node includes: the substrate node is connected to the polysilicon node through a buffer.

In an embodiment, the polysilicon node is disposed inside the polysilicon layer, and the substrate node is connected to the polysilicon node through a metal wire and metal in a via hole.

In an embodiment, when a voltage is input to the polysilicon layer, the polysilicon node collects an intermediate voltage of the polysilicon layer, and the intermediate voltage is a voltage value between the positive terminal voltage and the negative terminal voltage of the polysilicon layer.

In an embodiment, the polysilicon node is located on a cross section where a center line of the polysilicon layer is located.

In an embodiment, the substrate node is located on a cross section where a center line of the substrate layer is located.

In an embodiment, the polysilicon node collects the average value of the positive terminal voltage and the negative terminal voltage of the polysilicon layer.

In an embodiment, the polysilicon nodes disposed on the polysilicon layer include a first polysilicon node corresponding to the positive terminal voltage of the polysilicon layer, and a second polysilicon node corresponding to the negative terminal voltage of the polysilicon layer.

In an embodiment, the substrate nodes disposed on the substrate layer include a first substrate node and a second substrate node, where the first substrate node is connected to the first polysilicon node, and the second substrate node is connected to the second polysilicon node; the first substrate node is a node, at the substrate layer, residing on the same side as the first polysilicon node, and the second substrate node is a node at the substrate layer residing on the same side as the second polysilicon node.

In an embodiment, the first substrate node and the second substrate node are symmetric with respect to a center point of the substrate layer.

According to a third aspect, an embodiment of this application further provides a method for fabricating a semiconductor chip, including the following: providing a semiconductor substrate; implanting an N-well or implanting a P-well and a deep N-well in an upper surface area of the semiconductor substrate to form a substrate layer; growing an isolation layer in an upper surface area of the substrate layer; implanting a polysilicon layer in an upper surface area of the isolation layer, where the polysilicon layer, the isolation layer, and the substrate layer form a polysilicon resistor; and transmitting a voltage on the polysilicon layer to the substrate layer.

In an embodiment, the transmitting a voltage on the polysilicon layer to the substrate layer includes connecting a substrate node of the substrate layer to a polysilicon node corresponding to an intermediate voltage of the polysilicon layer, where the intermediate voltage is a voltage value between the positive terminal voltage and the negative terminal voltage of the polysilicon layer.

In an embodiment, the transmitting a voltage on the polysilicon layer to the substrate layer includes the following: connecting a first substrate node of the substrate layer to a first polysilicon node corresponding to a positive terminal voltage of the polysilicon layer; and connecting a second substrate node of the substrate layer to a second polysilicon node corresponding to a negative terminal voltage of the polysilicon layer, where the first substrate node is a substrate node at the substrate layer residing on the same side as the first polysilicon node, and the second substrate node is a substrate node at the substrate layer residing on the same side as the second polysilicon node.

In an embodiment, the transmitting a voltage on the polysilicon layer to the substrate layer includes adjusting a voltage value of the substrate layer to an average value of the positive terminal voltage and the negative terminal voltage of the polysilicon layer.

DESCRIPTION OF EMBODIMENTS

Embodiments of this application provide a polysilicon resistor, so as to reduce a voltage coefficient of the polysilicon resistor.

The following describes the embodiments of this application with reference to the accompanying drawings.

In the specification, claims, and accompanying drawings of this application, the terms "first", "second", and so on are intended to distinguish between similar objects but do not necessarily indicate a specific order or sequence. It should be understood that the terms used in such a way are interchangeable in proper circumstances, which is merely a discrimination manner that is used when objects having a same attribute are described in the embodiments of this application. In addition, the terms "include", "contain" and any other variants mean to cover the non-exclusive inclusion, so that a process, a method, a system, a product, or a device that includes a series of units is not necessarily limited to those units, but may include other units not expressly listed or inherent to such a process, method, system, product, or device.

The following separately provides detailed descriptions.

The polysilicon resistor provided in an embodiment of this application may also be referred to as a poly resistor. The voltage coefficient of the polysilicon resistor refers to a relative change in a resistance value for each voltage change by one volt within a specified voltage range. Because the resistance value decreases as the voltage increases, the voltage coefficient is usually expressed as a negative number. For example, the voltage coefficient can be calculated by using the following calculation formula:

$$\alpha=(R-R_0)/R_0(V-V_0)*10^6 \text{ (ppm/}V\text{)}$$

$R_0$ represents an initial value of the polysilicon resistor; R represents a measured value of the polysilicon resistor after the temperature changes; $V_0$ represents an initial voltage; V represents a changed voltage; and ppm represents parts per million.

Figure 1:
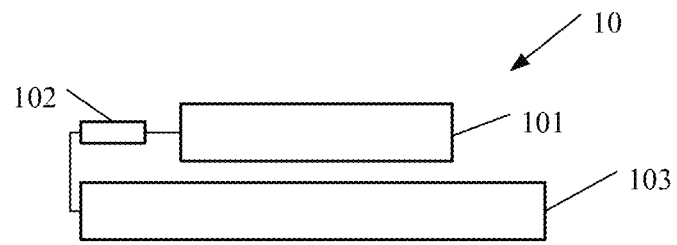
FIG. 1 is a schematic structural composition diagram of a polysilicon resistor according to an embodiment of this application.

FIG. 1 shows a polysilicon resistor 10 according to an embodiment of this application. The polysilicon resistor 10 includes a polysilicon layer 101, a voltage module 102, and a substrate layer 103.

The voltage module 102 is configured to transmit a voltage on the polysilicon layer 101 to the substrate layer 103.

In an embodiment of this application, the voltage module is a conduction module connected between the polysilicon layer and the substrate layer. The voltage module can transmit the voltage on the polysilicon layer to the substrate layer, so that the voltage on the polysilicon layer can be input to the substrate layer. In an embodiment, the voltage module is implemented in multiple manners, provided that the function of transmitting the voltage from the polysilicon layer to the substrate layer can be implemented. For example, the voltage module may be a wire through which the voltage on the polysilicon layer is transmitted to the substrate layer. For another example, the voltage module may also be a buffer and a wire. The voltage on the polysilicon layer is input to the buffer through the wire. After being buffered by the buffer, the voltage is input to the substrate layer through the wire.

It should be noted that the foregoing buffer is a circuit that makes the input equal to the output, and can be used to increase a driving capability. Because direct connection may have adverse impact on the polysilicon resistor, adding a buffer can avoid the impact.

It can be learned from the example description of this application in the foregoing embodiment that the polysilicon resistor includes a polysilicon layer, a voltage module, and a substrate layer. The voltage module is configured to transmit a voltage on the polysilicon layer to the substrate layer. In an embodiment of this application, the polysilicon resistor includes the voltage module. The voltage module can transmit the voltage of the polysilicon layer to the substrate layer. Therefore, the substrate layer is connected to the voltage of the polysilicon layer. When a positive terminal voltage and a negative terminal voltage of the polysilicon layer change, the voltage of the polysilicon layer can be transmitted to the substrate layer, so that a voltage of the substrate layer can be adjusted following the change of the positive terminal voltage and the negative terminal voltage of the polysilicon layer, that is, a voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

Figure 2:
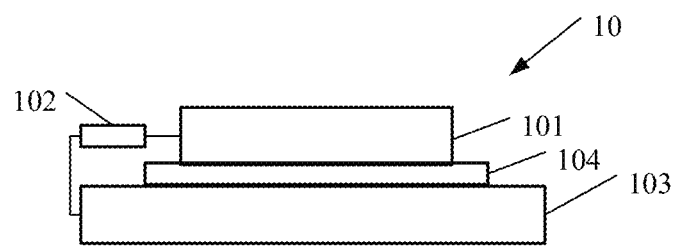
FIG. 2 is a schematic structural composition diagram of another polysilicon resistor according to an embodiment of this application.

FIG. 2 shows a polysilicon resistor 10 according to an embodiment of this application. The polysilicon resistor 10 includes a polysilicon layer 101, a voltage module 102, a substrate layer 103, and an isolation layer 104.

The voltage module 102 is configured to transmit a voltage on the polysilicon layer 101 to the substrate layer 103.

The polysilicon layer 101 is located in an upper surface area of the isolation layer 104.

The isolation layer 104 is located in an upper surface area of the substrate layer 103.

When a voltage is input to the polysilicon layer 101, the substrate layer 103 can receive the voltage of the polysilicon layer 101 transmitted by the voltage module 102. The voltage of the polysilicon layer 101 is formed by a positive terminal voltage and a negative terminal voltage of the polysilicon layer 101. Therefore, when the positive terminal voltage and the negative terminal voltage of the polysilicon layer 101 change, the voltage transmitted by the voltage module to the substrate layer is adjusted following the change in the positive terminal voltage and the negative terminal voltage of the polysilicon layer 101. For example, a voltage value of the substrate layer 103 may be an average value of the positive terminal voltage and the negative terminal voltage of the polysilicon layer 101, so that a resistance value of the polysilicon resistor 10 can remain constant within an effective error range. The effective error range of the polysilicon resistor can be determined based on precision of the polysilicon resistor in an actual scenario. For example, the effective error range may be one hundred thousandths. To be specific, when a floating error of the resistance value is controlled within the effective error range, it can be still determined that the resistance value (that is, resistivity) of the polysilicon resistor remains constant.

In an embodiment of this application, the polysilicon resistor has a substrate layer, and a voltage value of the substrate layer (that is, a substrate voltage or substrate potential) can be adjusted when the positive terminal voltage and the negative terminal voltage of the polysilicon layer change. In other words, the voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

It should be noted that in an embodiment of this application, the resistivity of the polysilicon resistor is inversely proportional to concentration of doped ions, and higher concentration of doped ions leads to lower resistivity of the polysilicon resistor. In the same ion implantation process, ion implantation doses at different positions are the same, so that concentration of doped ions in the polysilicon layer is the same, and the resistivity of the polysilicon resistor formed in the same ion implantation process is the same.

In an embodiment of this application, the polysilicon layer is made of silicon, and the isolation layer is used to isolate the polysilicon layer. The isolation layer 104 may be a shallow trench isolation (STI) structure, or a field oxide (FOX) layer or another isolation structure. The isolation layer can prevent electric leakage between the polysilicon layer and the substrate layer underneath.

In some embodiments of this application, the substrate layer includes an N-well and a P-type substrate, and the voltage transmitted by the voltage module to the substrate layer is applied to the N-well; alternatively, the substrate layer includes a deep N-well (DNW), a P-well, and a P-type substrate, and the voltage transmitted by the voltage module to the substrate layer is applied to the P-well.

The P-type substrate may also be referred to as a semiconductor substrate. If the substrate layer is an N-well, the polysilicon resistor formed through the substrate layer is the polysilicon resistor in the N-well, and the voltage transmitted by the voltage module to the substrate layer is applied to the N-well. For example, the voltage module connects the polysilicon layer and the N-well, so that the voltage of the polysilicon layer can be transmitted to the N-well. The substrate potential on the N-well cannot be less than zero. If the substrate layer is a DNW and a P-well, the polysilicon resistor formed through the substrate layer is the polysilicon resistor in the P-well, and the voltage transmitted by the voltage module to the substrate layer is applied to the P-well. For example, the voltage module connects the polysilicon layer and the P-well, so that the voltage of the polysilicon layer can be transmitted to the P-well.

It can be understood that, a type of the polysilicon resistor is determined by a type of implanted ions, and the type of implanted ions of the resistor is unrelated to the substrate layer.

In some embodiments of this application, the voltage value of the substrate layer is obtained after the voltage module transmits the voltage on the polysilicon layer to the substrate layer. When the positive terminal voltage and the negative terminal voltage of the polysilicon resistor change, the voltage value of the substrate layer can be adjusted following this change. There are many specific adjustment methods, such as a method for obtaining a voltage relationship between the resistance value and three terminals through test. It is possible to collect multiple sets of positive terminal voltages and negative terminal voltages of the polysilicon resistor, test voltage values at the substrate layer separately, and adjust the voltage values of the substrate layer. For example, the voltage value of the substrate layer may be equal to the average value of the positive terminal voltage and the negative terminal voltage of the polysilicon layer, where the average value of the positive terminal voltage and the negative terminal voltage means that averaging calculation is performed on the positive terminal voltage value and the negative terminal voltage value, and the calculated average value is the voltage value of the substrate layer. For example, the voltage value of the substrate layer is $V_{Sub}$, the positive terminal voltage of the polysilicon resistor is $V_{Plus}$, and the negative terminal voltage of the polysilicon resistor is $V_{Minus}$. When $V_{Sub}$ is half of $V_{Plus}$ and $V_{Minus}$, the resistance value of the polysilicon resistor remains constant within an effective error range, and impact of depletion of the polysilicon layer on the resistance value of the polysilicon resistor is eliminated, so that the voltage coefficient of the polysilicon resistor can be reduced.

In some embodiments of this application, the polysilicon layer includes a first polysilicon node corresponding to the positive terminal voltage of the polysilicon layer, and a second polysilicon node corresponding to the negative terminal voltage of the polysilicon layer;

the P-type substrate, the N-well, the first polysilicon node, and the second polysilicon node form an ohmic contact on the substrate layer; or the P-type substrate, the P-well, the first polysilicon node, and the second polysilicon node form an ohmic contact on the substrate layer.

A positive terminal voltage and a negative terminal voltage are input to the polysilicon layer, a node where the positive terminal voltage is input on the polysilicon layer is the first polysilicon node, and a node where the negative terminal voltage is input on the polysilicon layer is the second polysilicon node. The substrate layer including the N-well and the P-type substrate is used as an example. The P-type substrate, the N-well, the first polysilicon node corresponding to the positive terminal voltage of the polysilicon layer, the second polysilicon node corresponding to the negative terminal voltage of the polysilicon layer, and a semiconductor substrate of the semiconductor chip form an ohmic contact on the substrate layer.

Figure 3:
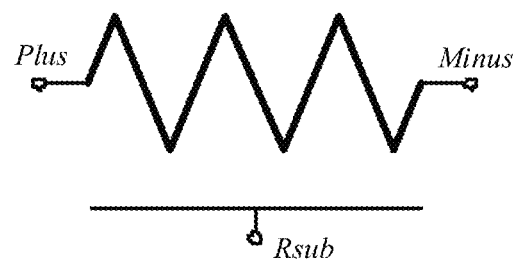
FIG. 3 is a schematic diagram of a substrate terminal formed in a polysilicon resistor according to an embodiment of this application.

FIG. 3 is a schematic diagram of a substrate terminal formed in a polysilicon resistor according to an embodiment of this application. The polysilicon resistor shown in FIG. 1 and FIG. 2 can be equivalent to the three-terminal device shown in FIG. 3. The two terminal nodes of the polysilicon resistor are Plus and Minus respectively, and the substrate layer of the polysilicon resistor includes a substrate node. The substrate node is the substrate terminal Rsub in FIG. 3, for example, the substrate node may be an ohmic contact point. Ohmic contact refers to a contact between metal and a semiconductor to form relatively small resistance, and the substrate terminal is externally connected to the substrate layer through the metal. The formation of an ohmic contact between metal and a semiconductor refers to pure resistance where the metal comes into contact with the semiconductor. The smaller the resistance, the better the effect is. In this case, when the polysilicon resistor is operated, most of the voltage drop occurs in an active region (Active region) instead of the contact surface. Therefore, current and voltage (I-V) characteristics of the polysilicon resistor forming the ohmic contact have a linear relationship. The larger the slope, the smaller the contact resistance. The size of the contact resistance directly affects the performance indicators of the device.

In some embodiments of this application, an input of the voltage module comes from an intermediate voltage of the polysilicon layer, and the intermediate voltage is a voltage value between the positive terminal voltage and the negative terminal voltage of the polysilicon layer.

The voltage module can be connected to a polysilicon node corresponding to the intermediate voltage of the polysilicon layer, so that the input of the voltage module comes from the intermediate voltage of the polysilicon layer; the voltage module can also be connected to the substrate node of the substrate layer, so that an input of the substrate node comes from an output of the voltage module.

The substrate layer is provided with a substrate node, and the polysilicon layer is provided with a polysilicon node. When a voltage is input to the polysilicon layer, a positive terminal voltage and a negative terminal voltage are generated at the positive terminal and the negative terminal of the polysilicon layer respectively. The voltage value of the polysilicon node may be a voltage value between the positive terminal voltage and the negative terminal voltage of the polysilicon layer. For example, the voltage value of the polysilicon node is a specific voltage value between the positive terminal voltage and the negative terminal voltage. In this case, the substrate node and the polysilicon node are connected through a voltage module. The voltage module may be a metal wire. The substrate node can also collect a voltage that is the same as the voltage value of the polysilicon node, that is, the voltage value of the substrate layer is equal to the voltage value between the positive terminal voltage and the negative terminal voltage of the polysilicon layer. Optionally, when a voltage is input to the polysilicon layer, where the voltage value of the polysilicon node is the middle value of the positive terminal voltage and the negative terminal voltage of the polysilicon layer, the input of the voltage module comes from the average value of the positive terminal voltage and the negative terminal voltage of the polysilicon layer, so that the voltage value of the substrate layer may be equal to the average value of the positive terminal voltage and the negative terminal voltage of the polysilicon layer.

In some embodiments of this application, the voltage module includes a first wire, a second wire, and a buffer, where
  each of the first wire and the second wire has two ends;
  the buffer is connected to one end of the first wire and one end of the second wire;
  the other end of the first wire is connected to the substrate layer, and the other end of the second wire is connected to the polysilicon layer.

The voltage module includes the buffer, an output end of the buffer is connected to the first wire, the first wire is then connected to the substrate layer; an input end of the buffer is connected to the second wire, and the second wire is then connected to the polysilicon layer, so that the voltage of the polysilicon layer can be transmitted to the substrate layer through the first wire, the second wire, and the buffer, and the voltage of the polysilicon layer can be input to the substrate layer.

Figure 4:
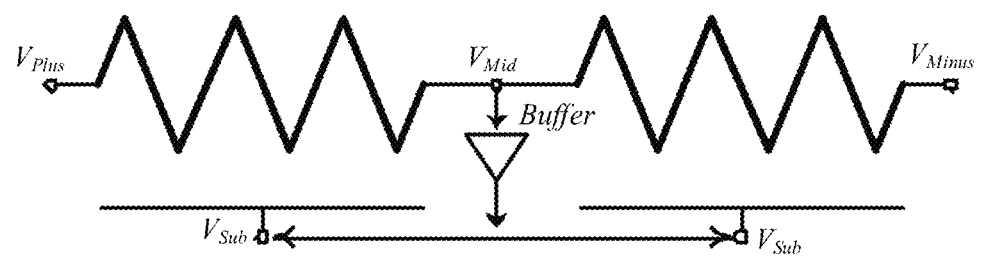
FIG. 4 is a schematic structural diagram of an adjustable substrate voltage of a polysilicon resistor according to an embodiment of this application.

For example, the substrate layer of the polysilicon resistor, the first polysilicon node corresponding to the positive terminal voltage of the polysilicon layer, the second polysilicon node corresponding to the negative terminal voltage of the polysilicon layer, and the semiconductor substrate of the semiconductor chip form an ohmic contact on the substrate layer. In other words, multiple ohmic contact points are formed on the substrate layer of the polysilicon resistor. FIG. 4 is a schematic structural diagram of an adjustable substrate voltage of a polysilicon resistor according to an embodiment of this application. The polysilicon node corresponding to the intermediate voltage is determined from the polysilicon resistor, and the substrate node of the substrate layer is connected to the polysilicon node corresponding to the intermediate voltage through the voltage module. The intermediate voltage is the voltage value between the positive terminal voltage and the negative terminal voltage of the polysilicon layer. To be specific, the substrate layer of the polysilicon resistor can be connected to the voltage value between the positive terminal voltage and the negative terminal voltage of the polysilicon resistor through the voltage module. For example, the voltage module is used to average the positive terminal voltage and the negative terminal voltage, and then the average voltage value is transmitted to the substrate layer through the voltage module. This can implement dynamic adjustment of the voltage value of the substrate layer, so that the resistance value of the polysilicon resistor remains constant within the effective error range, and the voltage coefficient of the polysilicon resistor is reduced.

It should be noted that, in an embodiment of this application, the substrate node on the substrate layer may be an ohmic contact point. For ease of understanding, when considering the solution in the present invention, a person skilled in the art can understand that a device with small resistance is selected to implement connection between the substrate layer and the polysilicon layer. Whether it is necessary to meet the specifications of the ohmic contact point can be determined based on the current process capability and performance requirements.

Further, when the substrate node of the substrate layer is connected to the polysilicon node corresponding to the intermediate voltage, the voltage module further includes a buffer, where the substrate node is connected to the polysilicon node through the first wire, the buffer, and the second wire. As shown in FIG. 4, for example, the voltage value of the substrate layer is $V_{Sub}$, the positive terminal voltage of the polysilicon resistor is $V_{Plus}$, the negative terminal voltage of the polysilicon resistor is $V_{Minus}$, and the intermediate voltage $V_{Mid}$ is a voltage value between the positive terminal voltage and the negative terminal voltage of the polysilicon layer. To reduce the voltage coefficient of the poly resistor, the substrate layer of the poly resistor is connected to the voltage value between the positive terminal voltage and the negative terminal voltage of the poly resistor through the voltage module. For example, an average value of the positive terminal voltage and the negative terminal voltage is calculated, and then the average voltage value is connected to the substrate node of the substrate layer through a buffer (buffer). The buffer is a circuit that makes the input equal to the output, and can be used to increase a driving capability. Because direct connection between the polysilicon layer and the substrate layer may have adverse impact on the poly resistor, adding a buffer can avoid the impact.

In some other embodiments of this application, the voltage module includes a first voltage unit and a second voltage unit, where
  two ends of the first voltage unit are respectively connected to a first substrate node of the substrate layer, and the first polysilicon node corresponding to the positive terminal voltage of the polysilicon layer;
  two ends of the second voltage unit are respectively connected to a second substrate node of the substrate layer, and the second polysilicon node corresponding to the negative terminal voltage of the polysilicon layer;
  the first substrate node is a node, at the substrate layer, residing on the same side as the first polysilicon node, and the second substrate node is a node at the substrate layer residing on the same side as the second polysilicon node.

In an embodiment, the first substrate node of the substrate layer is connected to the first polysilicon node corresponding to the positive terminal voltage of the polysilicon layer through the first voltage unit; the second substrate node of the substrate layer is connected to the second polysilicon node corresponding to the negative terminal voltage of the polysilicon layer through the second voltage unit; the first substrate node is a substrate node at the substrate layer residing on the same side as the first polysilicon node; the second substrate node is a substrate node at the substrate layer residing on the same side as the second polysilicon node.

It should be noted that, the first substrate node is a substrate node at the substrate layer residing on the same side as the first polysilicon node, where the same side may be the left side; the second substrate node is a substrate node at the substrate layer residing on the same side as the second polysilicon node, where the same side may be the right side.

In some embodiments of this application, the first substrate node and the second substrate node are symmetric with respect to a center point of the substrate layer. The center point of the substrate layer may be the center of the substrate layer. For example, if the substrate layer is a rectangle, the center point may be the intersection of two diagonal lines. For another example, if the substrate layer is a circle, the center point may be the center of the circle. The positive terminal voltage of the polysilicon layer can be input to the first substrate node through the first voltage unit, and the negative terminal voltage of the polysilicon layer can be input to the second substrate node through the second voltage unit. If the first substrate node and the second substrate node are symmetric with respect to the center point of the substrate layer, and voltages on the first substrate node and the second substrate node at the substrate layer can be averaged, so that the voltage value of the substrate layer may be equal to the average value of the voltages on the first substrate node and the second substrate node. This can implement dynamic adjustment of the voltage value of the substrate layer, so that the resistance value of the polysilicon resistor remains constant within the effective error range, and the voltage coefficient of the polysilicon resistor is reduced.

In some embodiments of this application, the first voltage unit includes a third wire, a fourth wire, and a first buffer, where each of the third wire and the fourth wire has two ends;
the first buffer is connected to one end of the third wire and one end of the fourth wire;
the other end of the third wire is connected to the first substrate node, and the other end of the fourth wire is connected to the first polysilicon node.

The first voltage unit includes the first buffer, an output end of the first buffer is connected to the third wire, the third wire is then connected to the substrate layer; an input end of the first buffer is connected to the fourth wire, and the fourth wire is then connected to the polysilicon layer, so that the positive terminal voltage of the polysilicon layer can be transmitted to the substrate layer through the third wire, the fourth wire, and the first buffer, and the voltage of the polysilicon layer can be input to the substrate layer.

In some embodiments of this application, the second voltage unit includes a fifth wire, a sixth wire, and a second buffer, where each of the fifth wire and the sixth wire has two ends;
the second buffer is connected to one end of the fifth wire and one end of the sixth wire;
the other end of the fifth wire is connected to the second substrate node, and the other end of the sixth wire is connected to the second polysilicon node.

The second voltage unit includes the second buffer, an output end of the second buffer is connected to the fifth wire, the fifth wire is then connected to the substrate layer; an input end of the second buffer is connected to the sixth wire, and the sixth wire is then connected to the polysilicon layer, so that the negative terminal voltage of the polysilicon layer can be transmitted to the substrate layer through the fifth wire, the sixth wire, and the second buffer, and the voltage of the polysilicon layer can be input to the substrate layer.

Figure 5:
FIG. 5 is a schematic structural diagram of an adjustable substrate voltage of another polysilicon resistor according to an embodiment of this application.

For example, the substrate layer of the polysilicon resistor, the first polysilicon node corresponding to the positive terminal voltage of the polysilicon layer, the second polysilicon node corresponding to the negative terminal voltage of the polysilicon layer, and the semiconductor substrate of the semiconductor chip form an ohmic contact on the substrate layer. In other words, multiple ohmic contact points are formed on the substrate layer of the polysilicon resistor. As shown in FIG. 5, in the foregoing embodiments of this application, the substrate potential on one side can also be connected to the positive terminal of the resistor, and the substrate potential on the other side can be connected to the negative terminal of the resistor, thereby reducing a modulation effect of the substrate potential of the poly resistor on the resistance value, and further reducing a voltage coefficient of the poly resistor.

As shown in FIG. 5, the voltage value of the substrate layer near the positive terminal voltage is $V_{sub+}$, the voltage value of the substrate layer near the negative terminal voltage is $V_{sub-}$, the positive terminal voltage of the polysilicon resistor is $V_{Plus}$, and the negative terminal voltage of the polysilicon resistor is $V_{Minus}$. The positive terminal voltage can be connected to the ohmic contact point on the substrate layer near the positive terminal, and the negative terminal voltage can be connected to the ohmic contact point on the substrate layer near the negative terminal. The connection manner includes connecting to the substrate layer through a voltage module, for example, through a first voltage unit and a second voltage unit. Each voltage unit includes a buffer (buffer) and a wire. The buffer is a circuit that makes the input equal to the output, and can be used to increase a driving capability. Because direct connection between the polysilicon layer and the substrate layer may have adverse impact on the poly resistor, adding a buffer can avoid the impact.

It should be noted that, in an embodiment of this application, the voltage of the substrate layer is obtained after the voltage module transmits the voltage on the polysilicon layer. For example, the voltage of the substrate layer may be equal to the average value of the positive terminal voltage and the negative terminal voltage of the polysilicon resistor. As shown in FIG. 4, the positive terminal voltage of the polysilicon resistor is $V_{Plus}$, the negative terminal voltage of the polysilicon resistor is $V_{Minus}$, and the intermediate voltage is $V_{Mid}$. The resistor in the left part and the resistor in the right part in FIG. 4 are two identical resistors. The polysilicon node corresponding to the intermediate voltage $V_{Mid}$ and the substrate layer are connected to each other through a voltage module, and the voltage of the substrate layer may be equal to the intermediate voltage $V_{Mid}$. As shown in FIG. 5, the left part of the substrate layer is connected to the polysilicon node corresponding to the positive terminal voltage of the polysilicon layer through the first voltage unit, and the right part of the substrate layer is connected to the polysilicon node corresponding to the negative terminal voltage of the polysilicon layer through the second voltage unit. Influced by the voltages at two terminals on the substrate layer, the substrate potential is equal to the average value of the voltages at the positive terminal and the negative terminal.

It can be learned from the example description of this application in the foregoing embodiment that the polysilicon resistor includes a polysilicon layer, a voltage module, and a substrate layer. The voltage module is configured to transmit a voltage on the polysilicon layer to the substrate layer. In an embodiment of this application, the polysilicon resistor includes the voltage module. The voltage module can transmit the voltage of the polysilicon layer to the substrate layer. Therefore, the substrate layer is connected to the voltage of the polysilicon layer. When a positive terminal voltage and a negative terminal voltage of the polysilicon layer change, the voltage of the polysilicon layer can be transmitted to the substrate layer, so that a voltage of the substrate layer can be adjusted following the change of the positive terminal voltage and the negative terminal voltage of the polysilicon layer, that is, a voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

Figure 6:
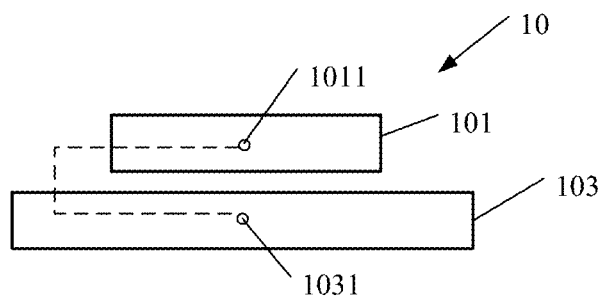
FIG. 6 is a schematic structural composition diagram of another polysilicon resistor according to an embodiment of this application.

Referring to FIG. 6, an embodiment of this application further provides a polysilicon resistor 10. The polysilicon resistor 10 includes a polysilicon layer 101 and a substrate layer 103.

A polysilicon node 1011 is disposed on the polysilicon layer 101.

A substrate node 1031 is disposed on the substrate layer 103, and the substrate node 1031 is connected to the polysilicon node 1011.

In FIG. 6, the substrate node 1031 and the polysilicon node 1011 are connected by using a dashed line, to illustrate that the substrate node 1031 is connected to the polysilicon node 1011. During actual fabrication of a semiconductor chip, the dashed line may be a metal wire, but a position of the metal wire can be adjusted based on a processing technique and requirement. This is only for schematic illustration, and is not intended to limit the embodiments of this application.

In an embodiment of this application, the polysilicon resistor has a substrate layer, and the substrate node is connected to the polysilicon node. When a voltage is input to the polysilicon layer, the polysilicon node also collects the voltage value because it is located at the polysilicon layer. The voltage value of the polysilicon node is transmitted to the substrate node, so that the substrate layer also generates a voltage, and a voltage value of the substrate layer (that is, a substrate voltage or substrate potential) can be adjusted when the positive terminal voltage and the negative terminal voltage of the polysilicon layer change. In other words, the voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

Figure 7:
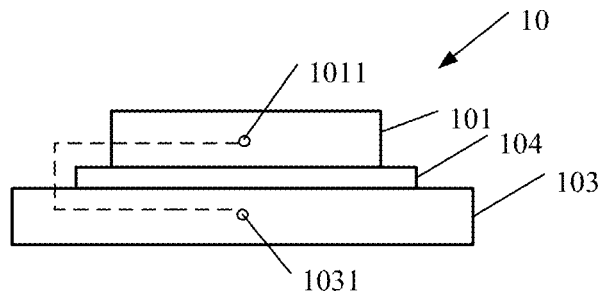
FIG. 7 is a schematic structural composition diagram of another polysilicon resistor according to an embodiment of this application.

As shown in FIG. 7, an embodiment of this application further provides a polysilicon resistor 10. The polysilicon resistor 10 includes a polysilicon layer 101, a substrate layer 103, and an isolation layer 104.

The polysilicon layer 101 is located in an upper surface area of the isolation layer 104. A polysilicon node 1011 is disposed on the polysilicon layer 101.

The isolation layer 104 is located in an upper surface area of the substrate layer 103.

A substrate node 1031 is disposed on the substrate layer 103, and the substrate node 1031 is connected to the polysilicon node 1011.

In some embodiments of this application, the substrate node is an ohmic contact point.

It should be noted that, the substrate node on the substrate layer may be an ohmic contact point. For ease of understanding, when considering the solution in the present invention, a person skilled in the art can understand that a device with small resistance is selected to implement connection between the substrate layer and the polysilicon layer. Whether it is necessary to meet the specifications of the ohmic contact point can be determined based on the current process capability and performance requirements.

In some embodiments of this application, that the substrate node is connected to the polysilicon node includes:
the substrate node is connected to the polysilicon node through a buffer.

The connection between the substrate node and the polysilicon node may include the following two cases: One connection manner is direct connection through a wire; and the other connection manner is connection through a buffer (buffer). It should be noted that the foregoing buffer is a circuit that makes the input equal to the output, and can be used to increase a driving capability. Because direct connection between the polysilicon layer and the substrate layer may have adverse impact on the polysilicon resistor, adding a buffer can avoid the impact.

In some embodiments of this application, the polysilicon node is disposed inside the polysilicon layer, and the substrate node is connected to the polysilicon node through a metal wire and metal in a via hole.

As shown in FIG. 6, a metal wire extends from the polysilicon node in the polysilicon layer, and a metal wire extends from the substrate node in the substrate layer. The two metal wires are connected through the metal in the via hole, so that the substrate node is connected to the polysilicon node through the metal wire and the metal in the via hole. When a voltage is input to the polysilicon layer, the polysilicon node also collects the voltage value because it is located at the polysilicon layer. The voltage value of the polysilicon node is transmitted to the substrate node, so that the substrate layer also generates a voltage.

In some embodiments of this application, when a voltage is input to the polysilicon layer, the polysilicon node collects the voltage value between the positive terminal voltage and the negative terminal voltage of the polysilicon layer.

The substrate layer is provided with a substrate node, and the polysilicon layer is provided with a polysilicon node. When a voltage is input to the polysilicon layer, a positive terminal voltage and a negative terminal voltage are generated at the positive terminal and the negative terminal of the polysilicon layer respectively. The voltage value of the polysilicon node may be a voltage value between the positive terminal voltage and the negative terminal voltage of the polysilicon layer. For example, the voltage value of the polysilicon node is a specific voltage value between the positive terminal voltage and the negative terminal voltage. In this case, the substrate node and the polysilicon node are connected through a metal wire. The substrate node can also collect a voltage that is the same as the voltage value of the polysilicon node, that is, the voltage value of the substrate layer is equal to the voltage value between the positive terminal voltage and the negative terminal voltage of the polysilicon layer.

In an embodiment, when a voltage is input to the polysilicon layer, the voltage value of the polysilicon node is the average value of the positive terminal voltage and the negative terminal voltage of the polysilicon layer, that is, the voltage value of the substrate layer is equal to the average value of the positive terminal voltage and the negative terminal voltage of the polysilicon layer.

In some embodiments of this application, the polysilicon node is located on a cross section where a center line of the polysilicon layer is located.

For example, the polysilicon layer may be a rectangle or a square of a regular shape, and the center line of the polysilicon layer may be a straight line where the center of the rectangle or square is located. When the polysilicon layer is of an irregular shape, the center line of the polysilicon layer may be a straight line where the midpoint between the leftmost node and the rightmost node of the polysilicon layer is located. As shown in FIG. 6 or FIG. 7, the polysilicon node 1011 is disposed on the cross section where the center line of the polysilicon layer 101 is located. When a voltage is input to the polysilicon layer, a positive terminal voltage and a negative terminal voltage are generated at the positive terminal and the negative terminal of the polysilicon layer respectively. The voltage value of the polysilicon node may be a voltage value between the positive terminal voltage and the negative terminal voltage of the polysilicon layer.

In some embodiments of this application, the substrate node is located on a cross section where a center line of the substrate layer is located.

For example, the substrate layer may be a rectangle or a square of a regular shape, and the center line of the substrate layer may be a straight line where the center of the rectangle or square is located. When the substrate layer is of an irregular shape, the center line of the polysilicon layer may be a straight line where the midpoint between the leftmost node and the rightmost node of the substrate layer is located. As shown in FIG. 6 or FIG. 7, the polysilicon node 1011 is disposed on the cross section where the center line of the polysilicon layer 101 is located, and the substrate node 1031 is disposed on the cross section where the center line of the substrate layer 103 is located. When a voltage is input to the polysilicon layer, a positive terminal voltage and a negative terminal voltage are generated at the positive terminal and the negative terminal of the polysilicon layer respectively. The voltage value of the polysilicon node may be a voltage value between the positive terminal voltage and the negative terminal voltage of the polysilicon layer. The voltage value of the polysilicon node is transmitted to the substrate node, so that the substrate layer also generates a voltage.

Figure 8:
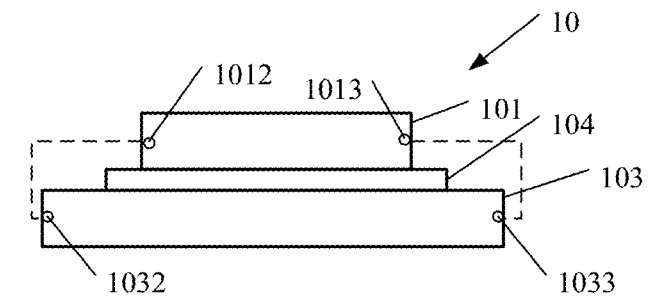
FIG. 8 is a schematic structural composition diagram of another polysilicon resistor according to an embodiment of this application.

In some embodiments of this application, as shown in FIG. 8, the polysilicon nodes disposed on the polysilicon layer include a first polysilicon node 1012 corresponding to the positive terminal voltage of the polysilicon layer, and a second polysilicon node 1013 corresponding to the negative terminal voltage of the polysilicon layer. The first polysilicon node 1012 is connected to the positive terminal voltage, and the second polysilicon node 1013 is connected to the negative terminal voltage.

In some embodiments of this application, the substrate nodes disposed on the substrate layer include a first substrate node 1032 and a second substrate node 1033.

The first substrate node 1032 is connected to the first polysilicon node 1012, and the second substrate node 1033 is connected to the second polysilicon node 1013; the first substrate node 1032 is a node, at the substrate layer, residing on the same side as the first polysilicon node 1012; the second substrate node 1033 is a node at the substrate layer residing on the same side as the second polysilicon node 1013.

It should be noted that, the first substrate node is a substrate node at the substrate layer residing on the same side as the first polysilicon node, where the same side may be the left side; the second substrate node is a substrate node at the substrate layer residing on the same side as the second polysilicon node, where the same side may be the right side.

In some embodiments of this application, the first substrate node and the second substrate node are symmetric with respect to a center point of the substrate layer. The center point of the substrate layer may be the center of the substrate layer. For example, if the substrate layer is a rectangle, the center point may be the intersection of two diagonal lines. For another example, if the substrate layer is a circle, the center point may be the center of the circle. The positive terminal voltage of the polysilicon layer can be input to the first substrate node through the first voltage unit, and the negative terminal voltage of the polysilicon layer can be input to the second substrate node through the second voltage unit. If the first substrate node and the second substrate node are symmetric with respect to the center point of the substrate layer, and voltages on the first substrate node and the second substrate node at the substrate layer can be averaged, so that the voltage value of the substrate layer may be equal to the average value of the voltages on the first substrate node and the second substrate node. This can implement dynamic adjustment of the voltage value of the substrate layer, so that the resistance value of the polysilicon resistor remains constant within the effective error range, and the voltage coefficient of the polysilicon resistor is reduced.

Figure 9:
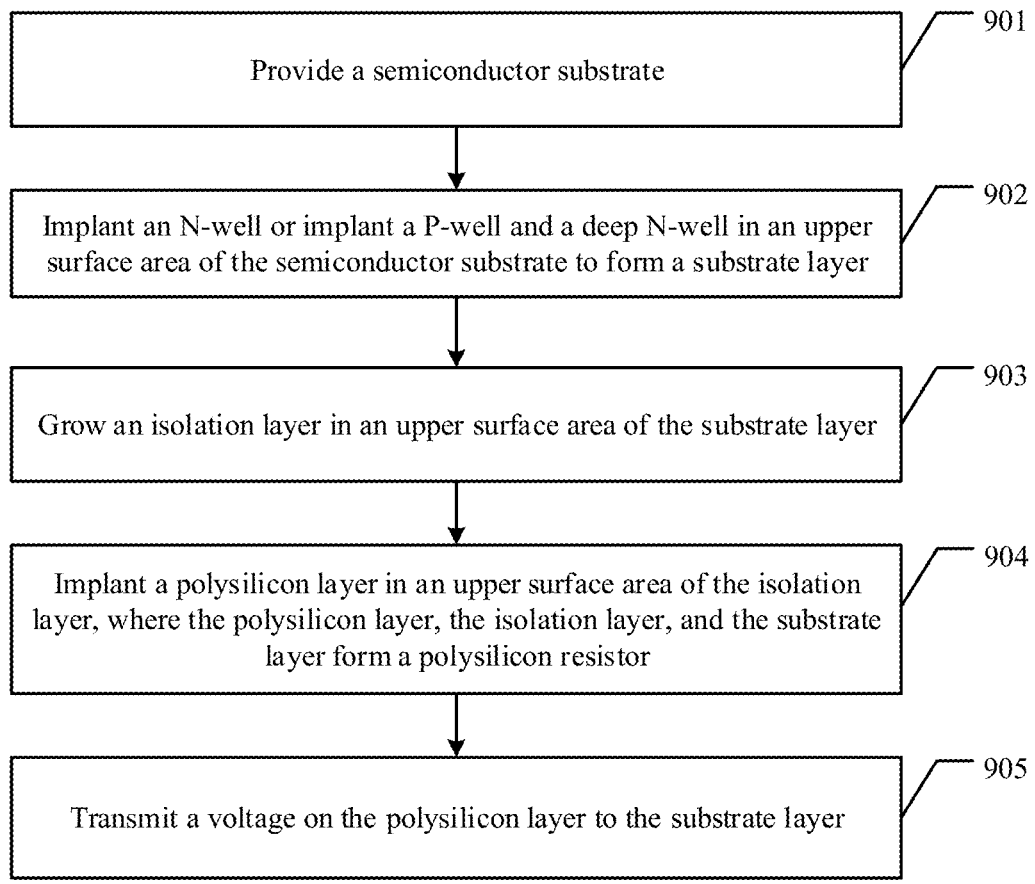
FIG. 9 is a schematic block flowchart of a method for fabricating a semiconductor chip according to an embodiment of this application.

The foregoing embodiments describe the semiconductor resistor according to the embodiments of this application. The following describes a method for fabricating a semiconductor chip according to the embodiments of this application. As shown in FIG. 9, a method for fabricating a semiconductor chip according to an embodiment of this application includes the following operations.

Operation 901: Provide a semiconductor substrate.

The semiconductor substrate may also be referred to as a P-type substrate. The semiconductor substrate is made of semiconductor materials such as silicon, germanium, silicon germanium, and gallium arsenide. A type of the semiconductor substrate can be selected based on a semiconductor device formed on the semiconductor substrate. The semiconductor substrate may be a P-type substrate.

Operation 902: Implant an N-well or implant a P-well and a deep N-well in an upper surface area of the semiconductor substrate to form a substrate layer.

The substrate layer can be formed by implanting the N-well on the provided semiconductor substrate, or the substrate layer can be formed by implanting the P-well and the deep N-well on the provided semiconductor substrate. There may be multiple types of the substrate layer. For example, the substrate layer includes an N-well and a P-type substrate; alternatively, the substrate layer includes a deep N-well (DNW), a P-well, and a P-type substrate, where the deep N-well is located in a lower outer surface area of the P-well. If the substrate layer is an N-well, the polysilicon resistor formed through the substrate layer is an N-type resistor. If the substrate layer is a DNW and a P-well, the polysilicon resistor formed through the substrate layer is a P-type resistor.

Operation 903: Grow an isolation layer in an upper surface area of the substrate layer.

The isolation layer is used to isolate the polysilicon layer. The isolation layer may be an STI structure, or a FOX layer or another isolation structure. The isolation layer can prevent electric leakage between the polysilicon layer and the substrate layer underneath.

Operation 904: Implant a polysilicon layer in an upper surface area of the isolation layer, where the polysilicon layer, the isolation layer, and the substrate layer form a polysilicon resistor.

The polysilicon layer is made of silicon, and the polysilicon layer, the isolation layer, and the substrate layer that are sequentially implanted can form the polysilicon resistor provided in the foregoing embodiment.

In some embodiments of this application, when multiple polysilicon resistors are disposed on the semiconductor chip, the semiconductor chip further includes a P-well implantation layer.

The P-well implantation layer isolates substrate layers of the multiple polysilicon resistors.

When there are many independent N-wells on the same chip, each N-well needs to be isolated by a P-implantation area to form an N-well or a deep N-well. P-type implantation is used to form a reverse-biased PN junction so that electrical isolation is formed between different N-wells.

Operation 905: Transmit a voltage on the polysilicon layer to the substrate layer.

In an embodiment of this application, after the polysilicon resistor is formed on the semiconductor substrate, a substrate voltage of the polysilicon resistor is not fixed to zero potential, and a voltage value of the substrate layer can be adjusted based on a change of a positive terminal voltage and a negative terminal voltage of the polysilicon layer.

The following uses examples to describe a manner of adjusting the substrate voltage. Operation 905 of transmitting a voltage on the polysilicon layer to the substrate layer includes the following:

adjusting a voltage value of the substrate layer to an average value of the positive terminal voltage and the negative terminal voltage of the polysilicon layer.

In an embodiment of this application, there may be many ways to adjust the voltage value of the substrate layer following the changes in the positive terminal voltage and the negative terminal voltage of the polysilicon resistor. For example, multiple sets of positive terminal voltages and negative terminal voltages of the polysilicon resistor can be collected, and voltage values at the substrate layer are tested separately, so that the resistance value of the polysilicon resistor remains constant.

In some embodiments of this application, operation 905 of transmitting a voltage on the polysilicon layer to the substrate layer includes the following:

connecting a substrate node of the substrate layer to a polysilicon node corresponding to an intermediate voltage of the polysilicon layer, where the intermediate voltage is a voltage value between the positive terminal voltage and the negative terminal voltage of the polysilicon layer.

For example, the voltage value of the substrate layer is equal to the voltage value between the positive terminal voltage and the negative terminal voltage of the polysilicon layer. For example, the voltage value of the substrate layer may be equal to the average value of the positive terminal voltage and the negative terminal voltage; to be specific, averaging calculation can be performed on the positive terminal voltage value and the negative terminal voltage value, and the calculated average value is the voltage value of the substrate layer. For example, the voltage value of the substrate layer is $V_{Sub}$, the positive terminal voltage of the polysilicon resistor is $V_{Plus}$, and the negative terminal voltage of the polysilicon resistor is $V_{Minus}$. When $V_{Sub}$ is half of $V_{Plus}$ and $V_{Minus}$, the resistance value of the polysilicon resistor remains constant within an effective error range, and impact of depletion of the polysilicon layer on the resistance value of the polysilicon resistor is eliminated, so that the voltage coefficient of the polysilicon resistor can be reduced.

In some other embodiments of this application, operation 905 of transmitting a voltage on the polysilicon layer to the substrate layer includes the following:

connecting the first substrate node of the substrate layer to the first polysilicon node corresponding to the positive terminal voltage of the polysilicon layer; and connecting the second substrate node of the substrate layer to the second polysilicon node corresponding to the negative terminal voltage of the polysilicon layer, where the first substrate node is a substrate node at the substrate layer residing on the same side as the first polysilicon node, and the second substrate node is a substrate node at the substrate layer residing on the same side as the second polysilicon node.

The first substrate node of the substrate layer is connected to the first polysilicon node corresponding to the positive terminal voltage of the polysilicon layer; the second substrate node of the substrate layer is connected to the second polysilicon node corresponding to the negative terminal voltage of the polysilicon layer; the first substrate node is a substrate node at the substrate layer residing on the same side as the first polysilicon node; the second substrate node is a substrate node at the substrate layer residing on the same side as the second polysilicon node.

As shown in FIG. 5, in the foregoing embodiments of this application, the substrate potential on one side can also be connected to the positive terminal of the resistor, and the substrate potential on the other side can be connected to the negative terminal of the resistor, thereby reducing a modulation effect of the substrate potential of the poly resistor on the resistance value, and further reducing a voltage coefficient of the poly resistor. It should be noted that, the first substrate node is a substrate node at the substrate layer residing on the same side as the first polysilicon node, where the same side may be the left side; the second substrate node is a substrate node at the substrate layer residing on the same side as the second polysilicon node, where the same side may be the right side.

It can be learned from the example description of this application in the foregoing embodiment that, in the method provided in an embodiment of this application, the voltage value of the substrate layer is adjusted following the changes in the positive terminal voltage and the negative terminal voltage of the polysilicon layer, so that the resistance value of the polysilicon resistor remains constant within the effective error range. In an embodiment of this application, the voltage value (that is, a substrate voltage or substrate potential) of the substrate layer of the polysilicon resistor can be adjusted when the positive terminal voltage and the negative terminal voltage of the polysilicon layer change. In other words, the voltage value of the substrate layer is no longer fixed to zero potential. Adjusting the voltage value of the substrate layer can change depletion distribution of the polysilicon resistor, and reduce a modulation effect of a substrate voltage of the polysilicon resistor on the resistance value, thereby reducing a voltage coefficient of the polysilicon resistor.

To better understand and implement the foregoing solutions in the embodiments of this application, the following uses a corresponding application scenario as an example for detailed description.

In the semiconductor chip provided in the embodiments of this application, the voltage coefficient of the poly resistor can be effectively reduced, ensuring system linearity. An embodiment of this application discloses a method for reducing a voltage coefficient of a poly resistor by dynamically adjusting a substrate voltage of the poly resistor without changing a process. The substrate voltage herein is a voltage value of the substrate layer of the poly resistor. In an embodiment of this application, the substrate potential of the poly resistor can be connected to the intermediate value between the positive terminal voltage and the negative terminal voltage of the resistor, so that the substrate voltage is equal to half of the positive terminal voltage value plus the negative terminal voltage value of the resistor. In an embodiment of this application, the substrate potential on one side can also be connected to the positive terminal of the resistor, and the substrate potential on the other side can be connected to the negative terminal of the resistor, thereby eliminating a modulation effect of the substrate potential of the poly resistor on the resistance value, and further reducing a voltage coefficient of the poly resistor.

Figure 10:
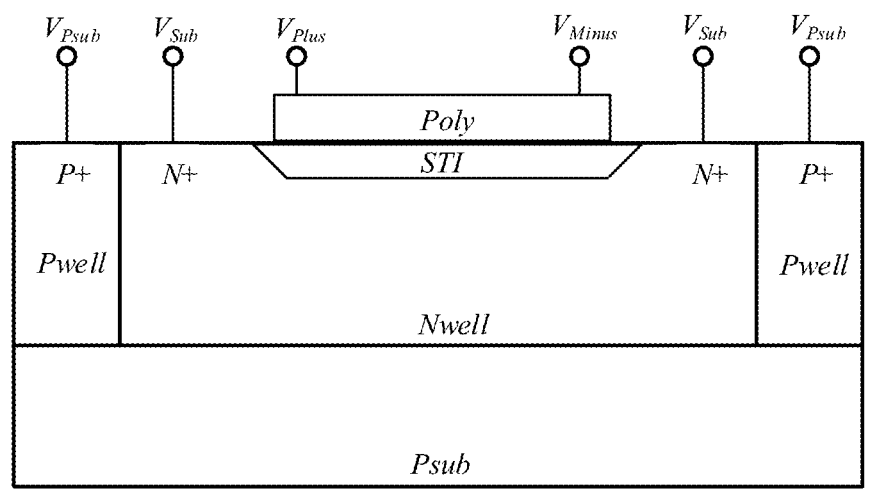
FIG. 10 is a schematic diagram of an application scenario of a semiconductor chip including an N-well polysilicon resistor according to an embodiment of this application.
Figure 11:
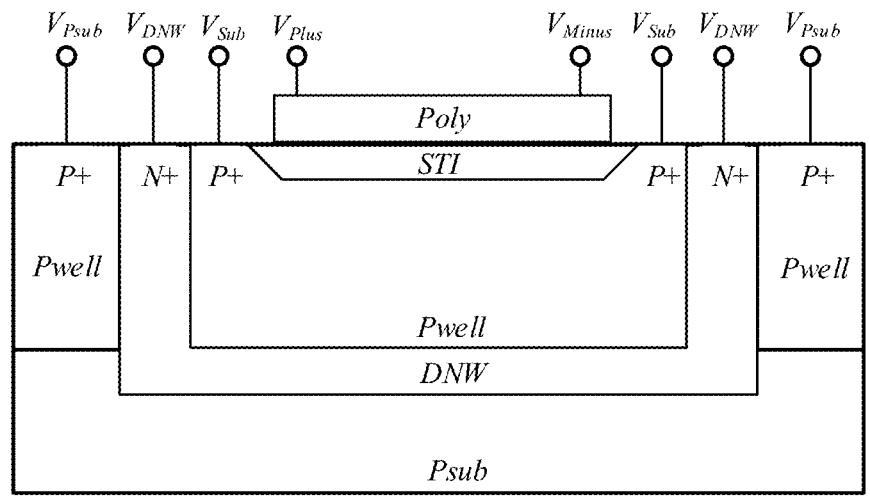
FIG. 11 is a schematic diagram of an application scenario of a semiconductor chip including a P-well polysilicon resistor according to an embodiment of this application.

The structure types of the poly resistor with adjustable substrate potential may include two types: P-type and N-type. A cross-sectional structure of the poly resistor provided in an embodiment of this application is described, as shown in FIG. 10 and FIG. 11. The N-type poly resistor shown in FIG. 10 includes a P-type substrate and an N-type implantation layer on the P-type substrate (Psub). There are many independent N-wells (Nwell) on the same chip, and each N-well is isolated by a P-implantation area to form the N-well shown in FIG. 10.

In the N-well shown in FIG. 10, a layer of STI is first grown to prevent electric leakage between the poly and the N-well underneath. The poly is deposited in an area above the STI as a main part of the poly resistor. Most of the poly near the middle, that is, the main part and the edge part are subsequently processed in different manners, and therefore resistance values are different. Finally, the main part is fabricated to form an ohmic contact with the Psub, the substrate layer (substrate, sub for short) of the poly resistor, and the positive terminal (plus) and the negative terminal (minus) of the poly resistor. Psub is the lowermost semiconductor substrate of the chip, and the substrate layer of the poly resistor is the area under poly and STI and above Psub. Therefore, the substrate layer of the poly resistor in FIG. 10 is the N-well, and the N-type implantation layer constitutes the substrate layer of the N-type poly resistor. The substrate layer is used to adjust and reduce the voltage coefficient of the poly resistor. The adjustable substrate voltage is connected to this N-type substrate.

FIG. 11 shows an N-type poly resistor, which includes a reverse-biased PN junction formed through P-type implantation, so that electrical isolation is formed between different N-wells. In the DNW shown in FIG. 11, P-type implantation is performed once again to form a P-well (Pwell), and a DNW and a P-well. In the P-well shown in FIG. 11, a layer of STI is first grown to prevent electric leakage between the poly and the N-well or the P-well underneath. The poly is deposited in an area above the STI as a main part of the poly resistor. Most of the poly near the middle, that is, the main part and the edge part are subsequently processed in different manners, and therefore resistance values are different. Finally, the main part is fabricated to form an ohmic contact with the Psub, the substrate layer of the poly resistor, and the positive terminal (plus) and the negative terminal (minus) of the poly resistor. Psub is the lowermost semiconductor substrate of the chip, and the substrate layer of the poly resistor is the area under poly and STI and above Psub. The substrate layer in the poly resistor in FIG. 11 is the P-well in the DNW. The P-well constitutes the substrate layer of the P-type poly resistor. The substrate layer is used to adjust and reduce the voltage coefficient of the poly resistor. The adjustable substrate voltage is connected to this P-type substrate.

N+ in the N-well is to implant N-type impurities of high concentration once again to make contact resistance at this point smaller, that is, to form an ohmic contact, so as to better control the potential of the N-well. For another example, P+ in the P-well is to implant P-type impurities of high concentration once again to make contact resistance at this point smaller, that is, to form an ohmic contact, so as to better control the potential of the P-well. Likewise, the voltage value of the substrate layer in FIG. 10 and FIG. 11 is $V_{Sub}$, the positive terminal voltage of the polysilicon resistor is $V_{Plus}$, the negative terminal voltage of the polysilicon resistor is VMinus, the voltage of the P-well implantation layer is $V_{psub}$, and the voltage of the DNW is $V_{DNW}$.

It should be noted that Psub is usually connected to zero potential, and therefore the N-well cannot be connected to potential less than 0, so as to prevent the PN junction from being forward biased and the chip from being faulty. Therefore, the substrate potential of the poly resistor in FIG. 10 cannot be less than 0. However, the DNW in FIG. 11 is connected to positive potential, and the PN junction is never forward biased. The P-well in the DNW may be positive or negative, and the substrate potential of the poly resistor in FIG. 11 may be positive or negative. Poly (polysilicon) is a commonly used material that can be used to make MOS transistors, resistors, and the like. A resistor made of poly is referred to as a poly resistor.

Figure 12:
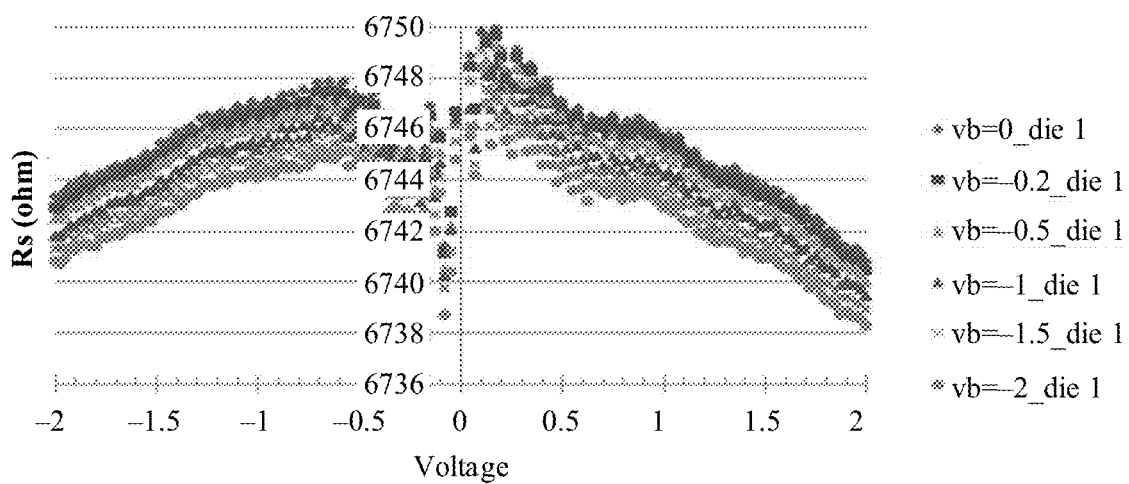
FIG. 12 is a schematic diagram of a resistance value of a polysilicon resistor varying with a substrate voltage according to an embodiment of this application.
Figure 13:
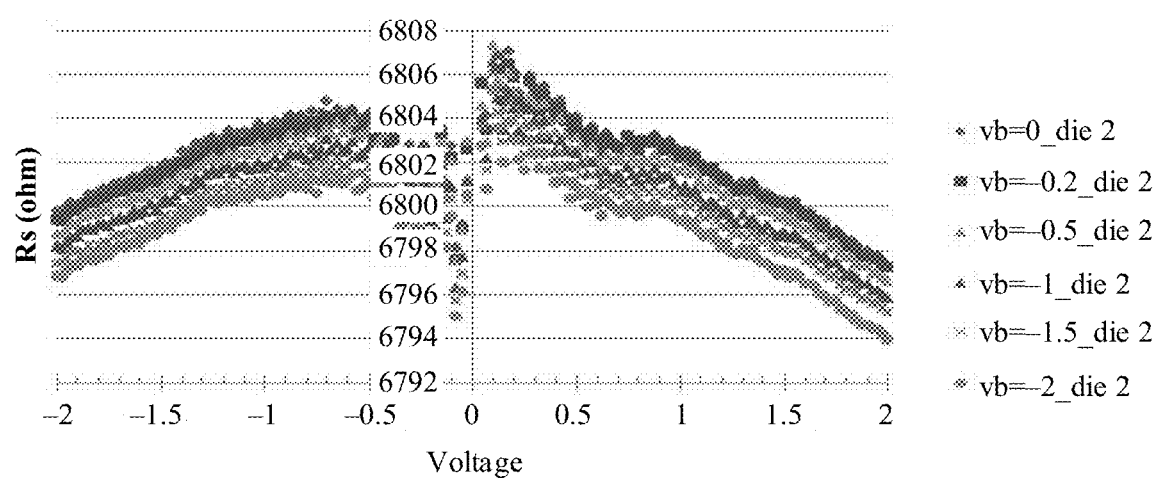
FIG. 13 is a schematic diagram of a resistance value of another polysilicon resistor varying with a substrate voltage according to an embodiment of this application.

As shown in FIG. 12 and FIG. 13, the negative terminal of the poly resistor is connected to zero potential. Under different substrate voltages (the symbol is vb), a change relationship between the resistance value and the positive terminal voltage is shown, where die1 represents chip 1, die2 represents chip 2, and Rs represents the resistance value of the poly resistor, measured in ohm (ohm). Values 6736 to 6750 in FIG. 12 are actually measured ohm values, and values 6792 to 6808 in FIG. 13 are actually measured ohm values. The substrate voltage is tested on two different chips. From the results of the two different chips in FIG. 12 and FIG. 13, it can be seen that when the voltage difference between the positive terminal and the negative terminal is equal, the substrate voltage has significant impact on the resistance value of the resistor.

In an embodiment of this application, the substrate voltage changes the depletion distribution (depletion) on the poly resistor. The depletion is mainly related to the difference between the voltage on the poly and the substrate voltage, that is, the depletion of the positive terminal of the poly resistor is related to $V_{Plus}-V_{Sub}$, and the depletion of the negative terminal of the poly resistor is related to $V_{Minus}-V_{Sub}$. It can be roughly considered that a ratio of the resistance value affected by the overall depletion of poly is α. Therefore, $$R = R_0\left(1 + \alpha\frac{V_{Plus} - V_{Sub}}{2} + \alpha\frac{V_{Minus} - V_{Sub}}{2}\right), \quad \text{(Formula 1)}$$

It is simplified as follows:

$$R = R_0 + \alpha R_0\left(\frac{V_{Plus} + V_{Minus}}{2} - V_{Sub}\right). \quad \text{(Formula 2)}$$

In the formulas, R represents the resistance value of the poly resistor, and $R_0$ represents the resistance value when the positive terminal voltage, the negative terminal voltage, and the substrate voltage of the poly resistor are all 0 V. It can be seen from Formula 2 that when $V_{Sub}$ is half of $V_{Plus}$ and $V_{Minus}$, the impact of poly depletion on the resistance value of the poly resistor is eliminated, so that the voltage coefficient can be reduced. α can be considered as an impact factor of the voltages at two terminals of the poly resistor on the electron distribution on the poly resistor.

Table 1 shows a change relationship between the resistance value of the poly resistor, and the voltages at two terminals and the substrate voltage. Under different conditions on the diagonal in Table 1, the difference in the resistance value of the poly resistor is very small.

| | V_Measure Measured values (unit: ohm) of Rs under different voltages | | | | |
|---|---|---|---|---|---|
| (V) | −2 | −1 | 0 | 1 | 2 |
| −2 | 683.778 | 683.749 | 683.727 | 683.704 | 683.681 |
| −1.5 | 683.800 | 683.771 | 683.749 | 683.726 | 683.704 |
| −1 | 683.823 | 683.794 | 683.772 | 683.749 | 683.726 |
| −0.5 | 683.845 | 683.816 | 683.794 | 683.771 | 683.749 |
| 0 | 683.867 | 683.838 | 683.816 | 683.794 | 683.771 |
| 0.5 | 683.890 | 683.861 | 683.839 | 683.816 | 683.794 |
| 1 | 683.912 | 683.883 | 683.861 | 683.838 | 683.816 |
| 1.5 | 683.934 | 683.905 | 683.883 | 683.861 | 683.838 |
| 2 | 683.956 | 683.928 | 683.906 | 683.883 | 683.861 |

Figure 14:
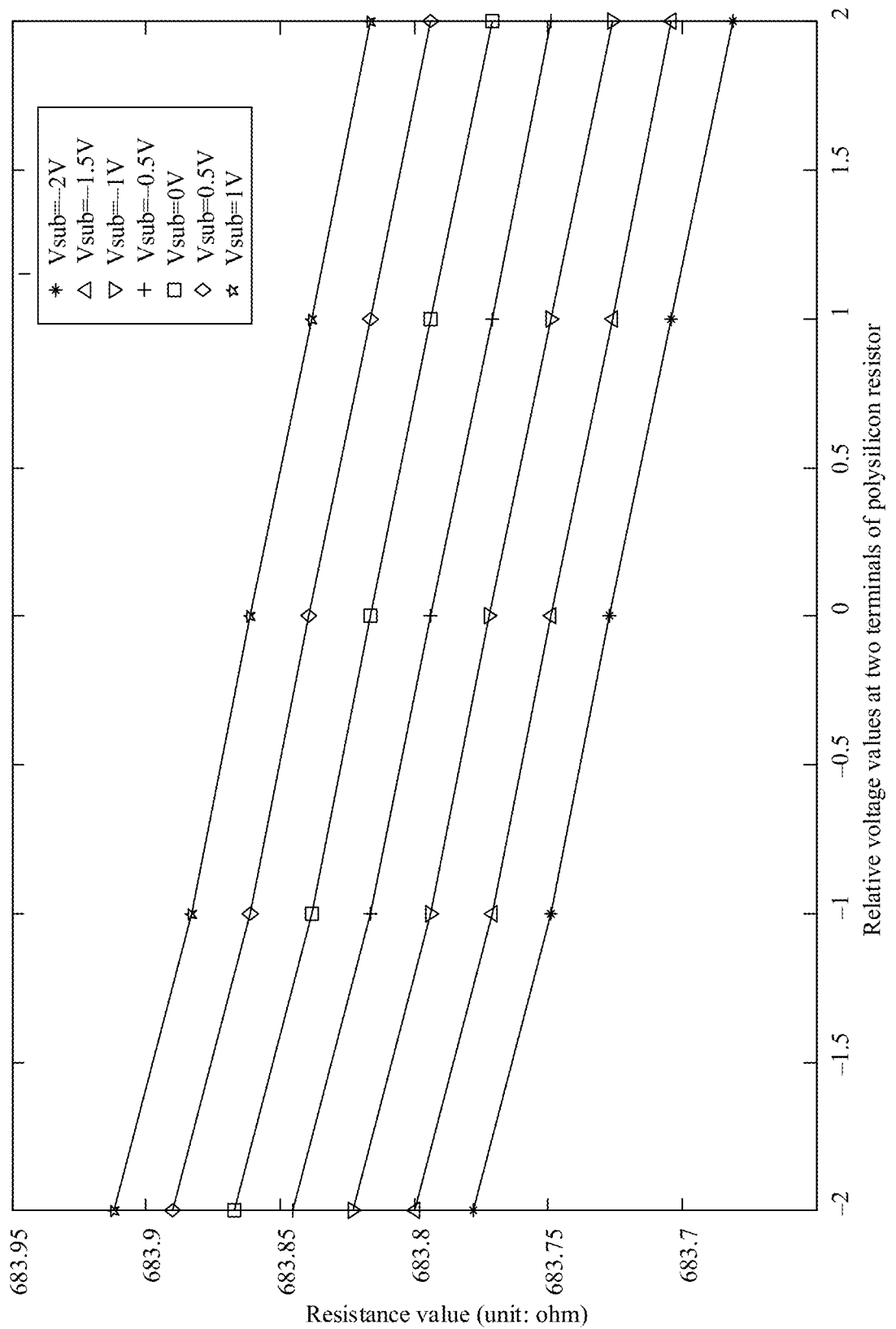
FIG. 14 is a schematic diagram of a curve showing a resistance value of a polysilicon resistor varying with voltages at both ends and a substrate voltage according to an embodiment of this application.

FIG. 14 shows a curve relationship between the resistance value of the poly resistor, and the voltages at two terminals and the substrate voltage. Description is provided by using different values of the substrate voltage $V_{Sub}$ as an example. FIG. 14 shows resistance values of different positive terminal voltages and substrate voltages obtained through simulation when the negative terminal voltage of the poly resistor is fixed to 0 V. The data shown in FIG. 14 is the statistical data in Table 1. It can be seen from FIG. 15 that the poly resistance is basically constant when the substrate potential varies with the positive terminal voltage and the negative terminal voltage of the resistor. This is consistent with Formula 2.

Figure 15:
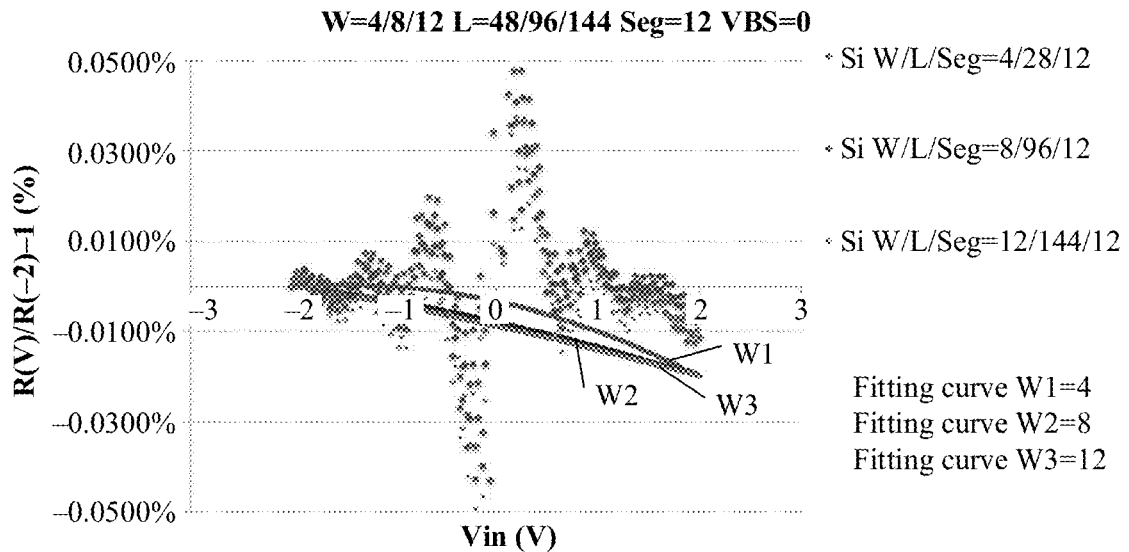
FIG. 15 is a schematic diagram of a voltage coefficient of a polysilicon resistor in the prior art.
Figure 16:
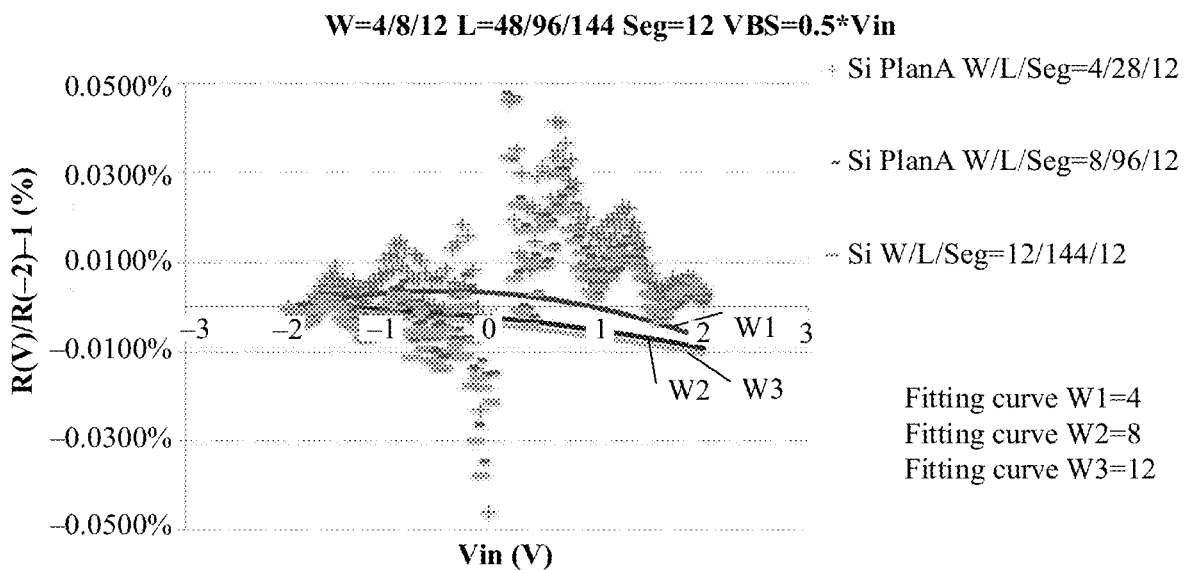
FIG. 16 is a schematic diagram of a voltage coefficient of a polysilicon resistor according to an embodiment of this application.

FIG. 15 shows a change relationship between the normalized poly resistance value and the voltages at two terminals of the poly resistor in the prior art when the solution that the substrate layer is connected to fixed zero potential in an embodiment of this application is not used. In FIG. 15, W represents a width of the resistor, L represents a length of the resistor, Seg represents a quantity of parallel segments of the resistor, and VBS represents the substrate potential of the poly resistor, which is fixed at 0. R(V)/R(−2) represents the "normalized poly resistance value", which is a ratio of another resistance value to the normalized resistance value 1 when −2 V is applied to two terminals. R(V)/R(−2)−1 is a resistance change rate. Si W/L/Seg represents silicon test data, Model in the lower part represents fitted data, and Vin represents the voltage value applied to two terminals of the poly resistor. In FIG. 15, three fitting curves are used as an example, where W1=4 μm, W2=8 μm, W3=12 μm. The test result shows that the resistance value of the poly resistor in the prior art changes greatly, and an amplitude of the resistance value change within ±2 V reaches 0.0200%. FIG. 16 shows that the voltage coefficient of the poly resistor is significantly reduced when a solution for adjusting the voltage of the substrate layer according to an embodiment of this application is used. In FIG. 16, Vin represents the voltage value applied to two terminals of the poly resistor, VBS represents the substrate potential of the poly resistor, and VBS is equal to 0.5 times Vin. After the solution in an embodiment of this application is used, the resistance value of the poly resistor changes slightly, an amplitude of the resistance value change within ±2 V is less than 0.0100%, and the voltage coefficient of the poly resistor is significantly reduced.

Figure 17:
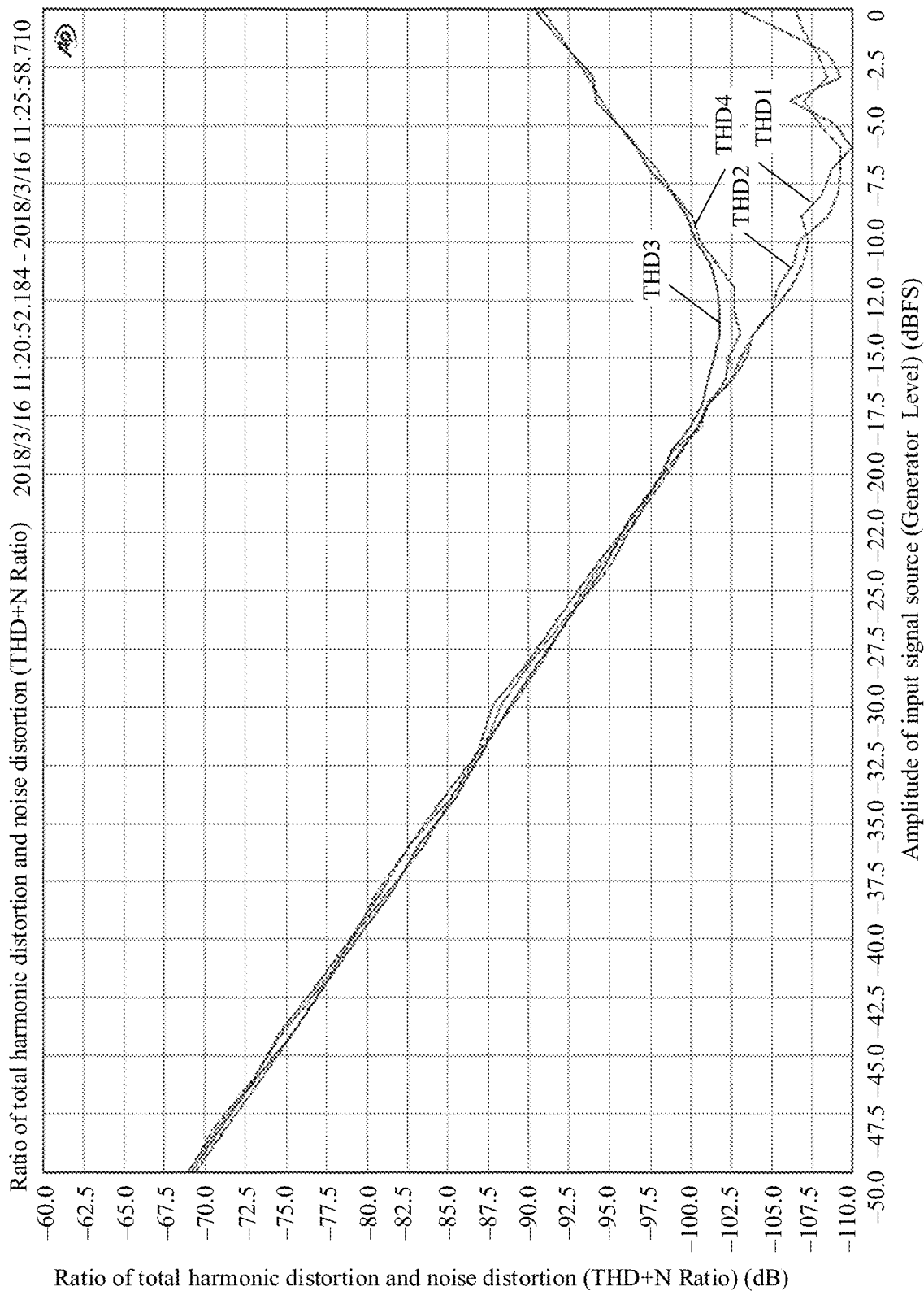
FIG. 17 is a schematic diagram of improving linearity of a power amplifier by using a polysilicon resistor according to an embodiment of this application.

FIG. 17 is a schematic diagram of improving linearity of a power amplifier by using a polysilicon resistor according to an embodiment of this application. The test instrument is Audio Precision. THD+N Ratio is the ratio of total harmonic distortion and noise distortion, and is an indicator used to measure nonlinearity of circuits and devices. FS stands for full scale, indicating full amplitude modulation. dBFS represents an amplitude of a digital signal, and the maximum value is 0, which represents 16 binary 1s (16-bit digital signal), or 24 1s (24-bit digital signal). CH represents a channel. Herein, performance of two channels is tested. When the solution in the prior art is used, a relationship between total harmonic distortion (THD) of a specific power amplifier (PA) and an output amplitude is THD1 and THD2. After the solution for adjusting the substrate voltage according to the embodiments of this application is used, the relationship between the THD of a PA and the output amplitude is THD3 and THD4. It can be seen that when the THD of the power amplifier has a large output amplitude, the linearity of the PA provided in the embodiments of this application is improved by at least 15 dB.

It can be learned from the foregoing example description that, in the embodiments of this application, the substrate voltage of the poly resistor follows the voltage change at two terminals of the resistor to eliminate the depletion of poly, thereby reducing the voltage coefficient of the poly resistor.

It should be noted that, for brief description, the foregoing method embodiments are represented as a series of action combinations. However, a person skilled in the art should appreciate that this application is not limited to the described order of the actions, because according to this application, some operations may be performed in other orders or simultaneously. A person skilled in the art should also know that the embodiments described in this specification are all example embodiments, and the actions and modules involved are not necessarily required.

In addition, it should be noted that the described apparatus embodiment is merely an example. The units described as separate parts may or may not be physically separate, and parts displayed as units may or may not be physical units, may be located at one position, or may be distributed on a plurality of network units. Some or all the modules may be selected according to actual needs to achieve the objectives of the solutions of the embodiments. In addition, in the accompanying drawings of the apparatus embodiments provided by this application, connection relationships between modules indicate that the modules have communication connections with each other, which may be specifically implemented as one or more communications buses or signal cables.

Based on the description of the foregoing implementations, a person skilled in the art may clearly understand that this application may be implemented by universal hardware, or by dedicated hardware, including a dedicated integrated circuit, a dedicated CPU, a dedicated memory, a dedicated component, and the like.

What is claimed is:
1. A polysilicon resistor, comprising:
   a polysilicon layer;
   a substrate layer; and
   a voltage module to transmit a voltage on the polysilicon layer to the substrate layer, wherein the voltage module comprises a buffer, wherein an input of the buffer is connected to the polysilicon layer and an output of the buffer is connected to the substrate layer.

2. The polysilicon resistor according to claim 1, wherein the substrate layer comprises an N-well and a P-type substrate, and the voltage transmitted by the voltage module to the substrate layer is applied to the N-well.

3. The polysilicon resistor according to claim 2, wherein the polysilicon layer comprises a first polysilicon node corresponding to a positive terminal voltage of the polysilicon layer and a second polysilicon node corresponding to a negative terminal voltage of the polysilicon layer;
the P-type substrate, the N-well, the first polysilicon node, and the second polysilicon node each form an ohmic contact on the substrate layer.

4. The polysilicon resistor according to claim 1, wherein an input of the voltage module receives an intermediate voltage of the polysilicon layer, and the intermediate voltage is between a positive terminal voltage and a negative terminal voltage of the polysilicon layer.

5. The polysilicon resistor according to claim 4, wherein the input of the voltage module represents an average value of the positive terminal voltage and the negative terminal voltage of the polysilicon layer.

6. The polysilicon resistor according to claim 1, wherein the voltage module comprises a first wire, and a second wire, wherein
each of the first wire and the second wire has two ends;
the buffer is connected to one end of the first wire and one end of the second wire; and
the other end of the first wire is connected to the substrate layer, and the other end of the second wire is connected to the polysilicon layer.

7. The polysilicon resistor according to claim 1, wherein the voltage module comprises a first voltage unit and a second voltage unit, wherein
two ends of the first voltage unit are respectively connected to a first substrate node of the substrate layer and a first polysilicon node corresponding to a positive terminal voltage of the polysilicon layer;
two ends of the second voltage unit are respectively connected to a second substrate node of the substrate layer and a second polysilicon node corresponding to a negative terminal voltage of the polysilicon layer; and
the first substrate node resides on a same side as the first polysilicon node, and the second substrate node resides on a same side as the second polysilicon node.

8. The polysilicon resistor according to claim 7, wherein the first substrate node and the second substrate node are symmetric with respect to a central point of the substrate layer.

9. The polysilicon resistor according to claim 7, wherein the first voltage unit comprises a third wire, a fourth wire, and a first buffer, wherein
each of the third wire and the fourth wire has two ends;
the first buffer is connected to one end of the third wire and one end of the fourth wire; and
the other end of the third wire is connected to the first substrate node, and the other end of the fourth wire is connected to the first polysilicon node.

10. The polysilicon resistor according to claim 7, wherein the second voltage unit comprises a fifth wire, a sixth wire, and a second buffer, wherein each of the fifth wire and the sixth wire has two ends;
the second buffer is connected to one end of the fifth wire and one end of the sixth wire; and
the other end of the fifth wire is connected to the second substrate node, and the other end of the sixth wire is connected to the second polysilicon node.

11. The polysilicon resistor according to claim 1, further comprising an isolation layer located in an upper surface area of the substrate layer, wherein the polysilicon layer is located in an upper surface area of the isolation layer.

12. A polysilicon resistor, comprising:
a polysilicon layer having a polysilicon node disposed thereon;
a buffer having an input and an output; and
a substrate layer having a substrate node disposed thereon, wherein the substrate node is connected to the output of the buffer and the input of the buffer is connected to the polysilicon node.

13. The polysilicon resistor according to claim 12, wherein the substrate node is an ohmic contact point.

14. The polysilicon resistor according to claim 12, wherein the polysilicon node is disposed inside the polysilicon layer, and the substrate node is connected to the polysilicon node through a metal wire and a metal in a via hole.

15. The polysilicon resistor according to claim 14, wherein when a voltage is input to the polysilicon layer, the polysilicon node collects an intermediate voltage of the polysilicon layer, and the intermediate voltage between a positive terminal voltage and a negative terminal voltage of the polysilicon layer.

16. The polysilicon resistor according to claim 15, wherein the polysilicon node is located on a cross section where a center line of the polysilicon layer is located, and the substrate node is located on a cross section where a center line of the substrate layer is located.

17. The polysilicon resistor according to claim 15, wherein the polysilicon node collects an average value of the positive terminal voltage and the negative terminal voltage of the polysilicon layer.

18. The polysilicon resistor according to claim 12, wherein the polysilicon node disposed on the polysilicon layer comprise a first polysilicon node corresponding to a positive terminal voltage of the polysilicon layer and a second polysilicon node corresponding to a negative terminal voltage of the polysilicon layer,
the substrate node disposed on the substrate layer comprises a first substrate node and a second substrate node, wherein
the first substrate node is connected to the first polysilicon node, and the second substrate node is connected to the second polysilicon node; and
the first substrate node resides on a same side as the first polysilicon node, and the second substrate node resides on a same side as the second polysilicon node.

19. The polysilicon resistor according to claim 18, wherein the first substrate node and the second substrate node are symmetric with respect to a central point of the substrate layer.

* * * * *